(12) United States Patent
Nagatani

(10) Patent No.: US 8,090,009 B2
(45) Date of Patent: Jan. 3, 2012

(54) TEST APPARATUS

(75) Inventor: Kenichi Nagatani, Tokyo (JP)

(73) Assignee: Advantest Corporation, Tokyo (JP)

( * ) Notice: Subject to any disclaimer, the term of this patent is extended or adjusted under 35 U.S.C. 154(b) by 1056 days.

(21) Appl. No.: 11/834,688

(22) Filed: Aug. 7, 2007

(65) Prior Publication Data
US 2009/0041101 A1 Feb. 12, 2009

(51) Int. Cl.
*H04B 3/46* (2006.01)
*H04B 1/38* (2006.01)
*H04L 7/00* (2006.01)
*H03D 3/24* (2006.01)

(52) U.S. Cl. ........ 375/224; 375/221; 375/225; 375/226; 375/371; 375/376

(58) Field of Classification Search .......... 375/221–226, 375/371, 376; 714/716
See application file for complete search history.

(56) References Cited

U.S. PATENT DOCUMENTS

| 7,017,087 B2 * | 3/2006 | Panis et al. ............... 714/716 |
| 2005/0129104 A1 * | 6/2005 | Ishida et al. ............. 375/224 |
| 2006/0227918 A1 * | 10/2006 | Kolbehdari ............... 375/371 |
| 2008/0151981 A1 * | 6/2008 | Ichiyama et al. ......... 375/226 |

* cited by examiner

*Primary Examiner* — Khanh C Tran
*Assistant Examiner* — Eboni Hughes
(74) *Attorney, Agent, or Firm* — Osha • Liang LLP

(57) ABSTRACT

A test apparatus includes a transmitting-side jitter measuring unit which measures a jitter of a transmission signal output from a transmitting circuit, a jitter applying unit which applies a jitter to the transmission signal and inputs the signal to a receiving circuit, a jitter range measuring unit which determines whether the logical value of the transmission signal detected by the receiving circuit is equal to a preset expectation value for each amplitude of the jitter applied to the transmission signal by the jitter applying unit, and measures the range of jitter amplitudes within which the logical value of the transmission signal is equal to the expectation value, and a jitter tolerance measuring unit which calculates jitter tolerance of the receiving circuit based on the jitter of the transmission signal measured by the transmitting-side jitter measuring unit and the range of jitter amplitudes measured by the jitter range measuring unit.

7 Claims, 5 Drawing Sheets

TEST APPARATUS

BACKGROUND

1. Technical Field

The present invention relates to a test apparatus. Particularly, the present invention relates to a test apparatus which tests the jitter tolerance of a receiving circuit, by applying a jitter to a transmission signal output from a transmitting circuit and inputting the signal to the receiving circuit.

2. Related Art

As a test on a device under test such as a semiconductor circuit, etc., such a test is known, which measures the jitter tolerance of the device under test. This test examines the jitter tolerance of the device under test, by varying the amplitude of the jitter to be applied to the signal to be input to the device under test, and measuring the range of jitter amplitudes within which the device under test can operate normally.

Further, there is known a technique which uses the above-described test in the loopback test on a SerDes circuit, for example, as disclosed in U.S. Pat. No. 7,017,087. In this test, a jitter means applies a jitter having a desired amplitude to a signal output from a transmitter Tx in the SerDes circuit, and inputs the signal to a receiver Rx in the SerDes circuit. The jitter tolerance of the receiver Rx can be measured from the range of the amounts of jitters applied, within which the receiver Rx has operated normally.

In this case, in order to precisely measure the jitter tolerance, it is preferable to precisely control the amount of the jitter to be included in the signal to be input to the receiver Rx. However, the signal to be input to the receiver Rx includes not only the jitter applied by the jitter applying means, but jitters that have occurred in the transmitter Tx, etc.

Therefore, according to the conventional test, errors can be included in the values measured as the jitter tolerance, due to the jitters that have occurred in the transmitter Tx, etc. Though it is conceivable to control the jitters which can occur in the transmitter Tx, etc., it is difficult to precisely control such jitters that can occur in the transmitter Tx, etc.

SUMMARY

Hence, it is an object of the innovation included herein to provide a test apparatus which can solve the above-described problem. This object will be achieved by combinations of the features recited in the independent claims in the scope of claims. The dependent claims define additional advantageous specific examples of the present invention.

That is, according to one example of an apparatus according to an aspect relating to the innovation included herein, a test apparatus is provided which tests the jitter tolerance of a receiving circuit by applying a jitter to a transmission signal output from a transmitting circuit and inputting the transmission signal to the receiving circuit, and which includes a transmitting-side jitter measuring unit that measures a jitter of the transmission signal output from the transmitting circuit, a jitter applying unit that applies a jitter to the transmission signal output from the transmitting circuit and inputs the signal to the receiving circuit, a jitter range measuring unit that determines whether or not the logical value of the transmission signal detected by the receiving circuit is equal to a preset expectation value for each amplitude of the jitter applied to the transmission signal by the jitter applying unit and measures the range of amplitudes of the jitter within which the logical value of the transmission signal is equal to the expectation value, and a jitter tolerance measuring unit that measures the jitter tolerance of the receiving circuit based on the jitter of the transmission signal measured by the transmitting-side jitter measuring unit and the range of the amplitudes of the jitter measured by the jitter range measuring unit.

The above summary of the invention does not recite all the necessary features of the present invention, and sub-combinations of these features could also provide inventions.

DESCRIPTION OF EXEMPLARY EMBODIMENTS

One aspect of the present invention will be explained below through embodiments of the invention, but the embodiments below are not intended to limit the invention set forth in the claims and all the combinations of the features described in the embodiments are not necessarily indispensable to the means of solving provided by the present invention.

Figure 1:
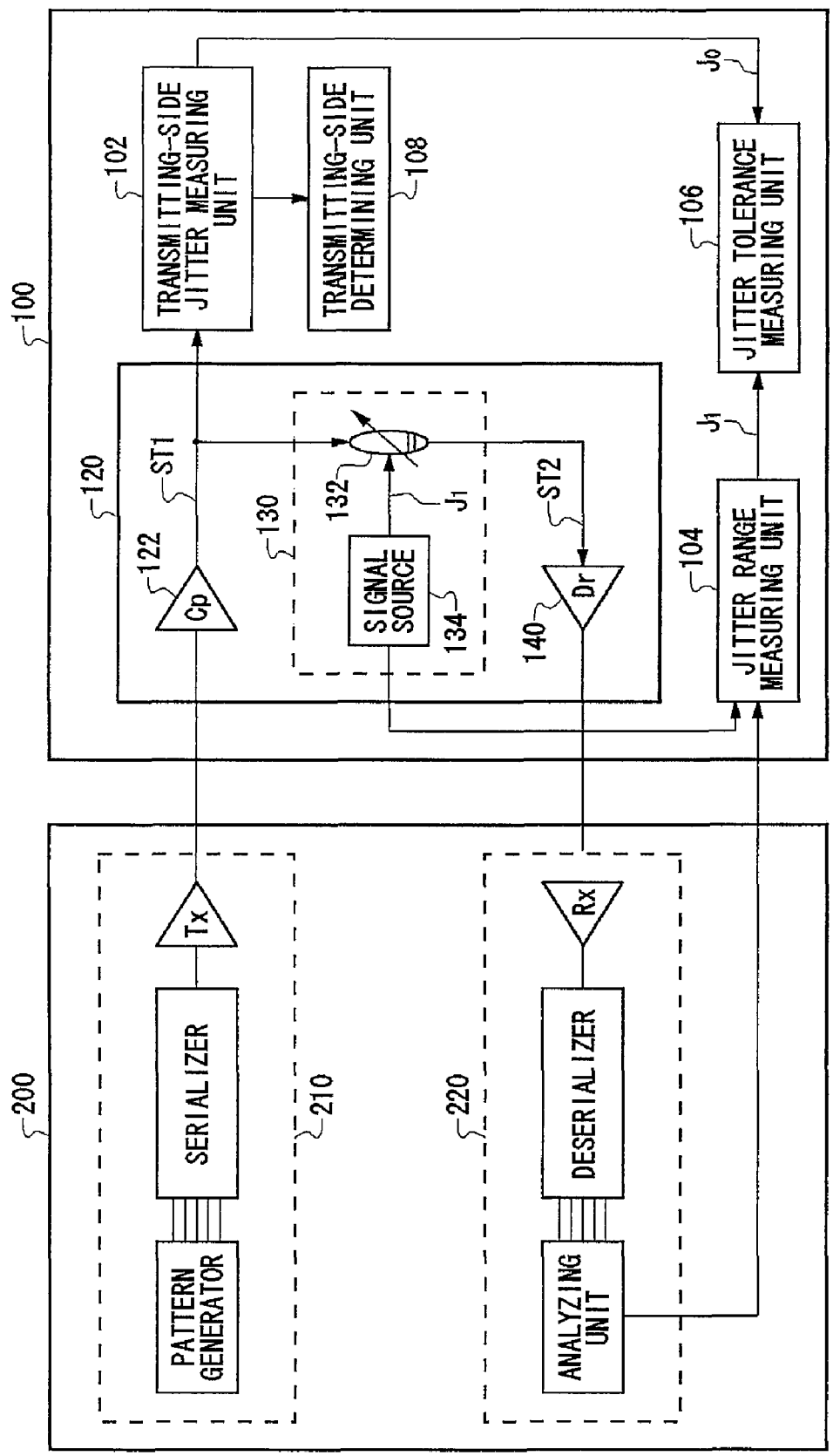
FIG. 1 is a diagram illustrating one example of the configuration of a test apparatus 100 according to one embodiment of the present invention.

FIG. 1 is a diagram illustrating one example of the configuration of a test apparatus 100 according to one embodiment of the present invention. The test apparatus 100 applies a jitter having a predetermined amplitude to a transmission signal output from a transmitting circuit 210, and inputs the signal to a receiving circuit 220, thereby to test the jitter tolerance of the receiving circuit 220.

The transmitting circuit 210 and receiving circuit 220 of the present example are mounted on the same chip. For example, the transmitting circuit 210 and receiving circuit 220 are a transmitting circuit 210 and a receiving circuit 220 of a device under test 200, which may be a SerDes circuit or the like. The test apparatus 100 of the present example applies a jitter to a loopback signal in a loopback test on the SerDes circuit.

The test apparatus 100 includes a jitter applying circuit 120, a transmitting-side jitter measuring unit 102, a jitter range measuring unit 104, a jitter tolerance measuring unit 106, and a transmitting-side measuring unit 108. The jitter applying circuit 120 applies a jitter having a predetermined amplitude to a transmission signal output from the transmitting circuit 210, and inputs the signal to the receiving circuit 220.

The jitter range measuring unit 104 measures the range of jitters within which the receiving circuit 220 operates normally. The jitter applying circuit 120 gradually changes the amplitude of the jitter to be applied to the transmission signal. The jitter range measuring unit 104 determines whether or not the logical value of the transmission signal detected by an analyzing unit or the like of the receiving circuit 220 is equal to a preset expectation value, for each amplitude of the jitter applied by the jitter applying circuit 120. By doing so, the jitter range measuring unit 104 measures the range of amplitudes of the jitter, within which the logical value of the transmission signal is equal to the expectation value.

The jitter applying circuit 120 includes a level comparing unit 122, a jitter applying unit 130, and a driver unit 140. The level comparing unit 122 receives the transmission signal output from the transmitting circuit 210, compares the signal level of the transmission signal with a preset threshold level, and outputs a logical value corresponding to the result of comparison as a transmission signal ST1. For example, the level comparing unit 122 outputs an H logic in a case where the signal level of the transmission signal output from the transmitting circuit 210 is higher than the threshold level, and outputs an L logic in a case where the signal level of the transmission signal is lower than the threshold level.

The jitter applying unit 130 applies a jitter J1 having a predetermined amplitude to the transmission signal ST1 output from the level comparing unit 122. The jitter applying unit 130 includes a variable delay circuit 132 and a signal source 134.

The variable delay circuit 132 outputs a transmission signal ST2, which is obtained by delaying the transmission signal ST1. The signal source 134 controls the amount of delay to be used by the variable delay circuit 132, according to the jitter J1 to be applied to the transmission signal ST2. For example, the signal source 134 can have a jitter having an amplitude A applied to the transmission signal ST2, by changing the amount of delay used by the variable delay circuit 132 in a manner that the peak-to-peak value of the signal becomes A.

The signal source 134 is also configured capable of varying the amplitude of the jitter, which the variable delay circuit 132 is to generate. The signal source 134 is allowed to change the amplitude of the jitter, in a case where it is notified by the jitter range measuring unit 104 that the jitter range measuring unit 104 has performed determination at that amplitude of the jitter.

The variable delay circuit 132 inputs the transmission signal ST2 to the receiving circuit 220 via the driver unit 140. The driver unit 140 inputs the received transmission signal ST2 to the receiving circuit 220 without changing the edge timings of the transmission signal ST2.

The transmission signal ST2 which the driver unit 140 inputs to the receiving circuit 220 includes the jitter J1 applied by the jitter applying unit 130, and in addition, a jitter J0 which has occurred in the transmitting circuit 210. Therefore, the range of the jitter measured by the jitter range measuring unit 104 includes an error corresponding to the jitter J0 that has occurred in the transmitting circuit 210.

The transmitting-side jitter measuring unit 102 measures the jitter of the transmission signal output from the transmitting circuit 210. The transmitting-side jitter measuring unit 102 of the present example receives the transmission signal ST1 output from the level comparing unit 122, and measures the amplitude value of the jitter of the received transmission signal ST1. The transmitting-side jitter measuring unit 102 may measure the peak-to-peak value of the amplitude of the jitter of the transmission signal ST1, or the RMS value thereof. The transmitting-side jitter measuring unit 102 may use a known jitter measuring device.

The jitter tolerance measuring unit 106 calculates the range of jitter amplitudes (jitter tolerance) within which the receiving circuit 220 can operate normally, based on the range of the amplitudes of the jitter measured by the jitter range measuring unit 104 and the amplitude value of the jitter of the transmission signal measured by the transmitting-side jitter measuring unit 102. The jitter J included in the transmission signal ST2 input to the receiving circuit 220 of the present example is expressed by the following equation.

$$J = J0 + J1$$

where J0 indicates the jitter that has occurred in the transmitting circuit 210, and J1 indicates the jitter applied by the jitter applying unit 130.

The jitter tolerance measuring unit 106 may measure the jitter tolerance of the receiving circuit 220, by adding the amplitude value of the jitter J0 measured by the transmitting-side jitter measuring unit 102 to the upper limit of the range of the amplitudes of the jitter measured by the jitter range measuring unit 104 based on the jitter J1 applied by the jitter applying unit 130.

The transmitting-side determining unit 108 may determine whether the transmitting circuit 210 is good or bad, according to whether the amplitude value of the jitter measured by the transmitting-side jitter measuring unit 102 is within a preset range or not. Further, the test apparatus 100 may determine whether the receiving circuit 220 is good or bad, according to whether the jitter tolerance measured by the jitter tolerance measuring unit 106 is within a preset range or not. Furthermore, the test apparatus 100 may determine that the device under test 200 is a good device, in a case where both the transmitting circuit 210 and the receiving circuit 220 are good ones.

Figure 2:
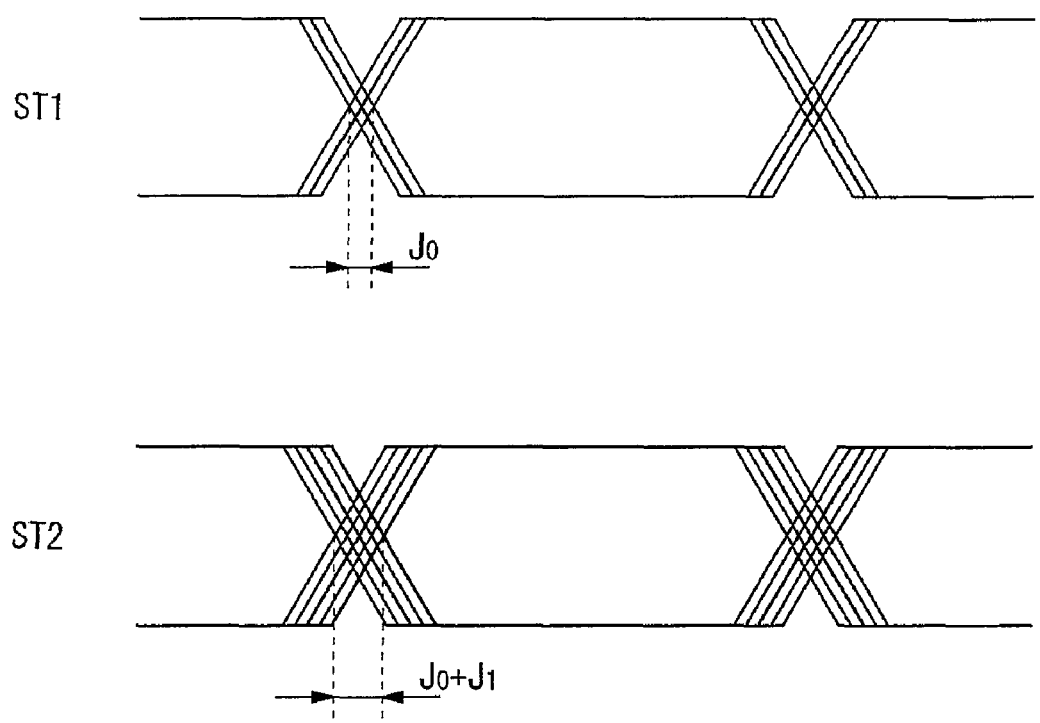
FIG. 2 is a diagram illustrating one example of the waveforms of a transmission signal ST1 and a transmission signal ST2, which are transmitted through a jitter applying circuit 120.

FIG. 2 is a diagram illustrating one example of the waveforms of the transmission signals ST1 and ST2, which are transmitted through the jitter applying circuit 120. The transmission signal ST1 received from the transmitting circuit 210 includes the jitter J0 which has occurred in the transmitting circuit 210. The jitter range measuring unit 104 measures the range of the amplitudes of the jitter J1 within which the receiving circuit 220 can operate normally, whereas a jitter, which amounts to J0+J1, is applied to the receiving circuit 220.

In this regard, the test apparatus 100 adds the amplitude value of the jitter J0 measured by the transmitting-side jitter measuring unit 102, to the upper limit of the range of the amplitudes of the jitter J1 measured by the jitter range measuring unit 104. Hence, the jitter tolerance of the receiving circuit 220, that is based on the amplitudes of the jitter actually input to the receiving circuit 220, can be measured.

Figure 3:
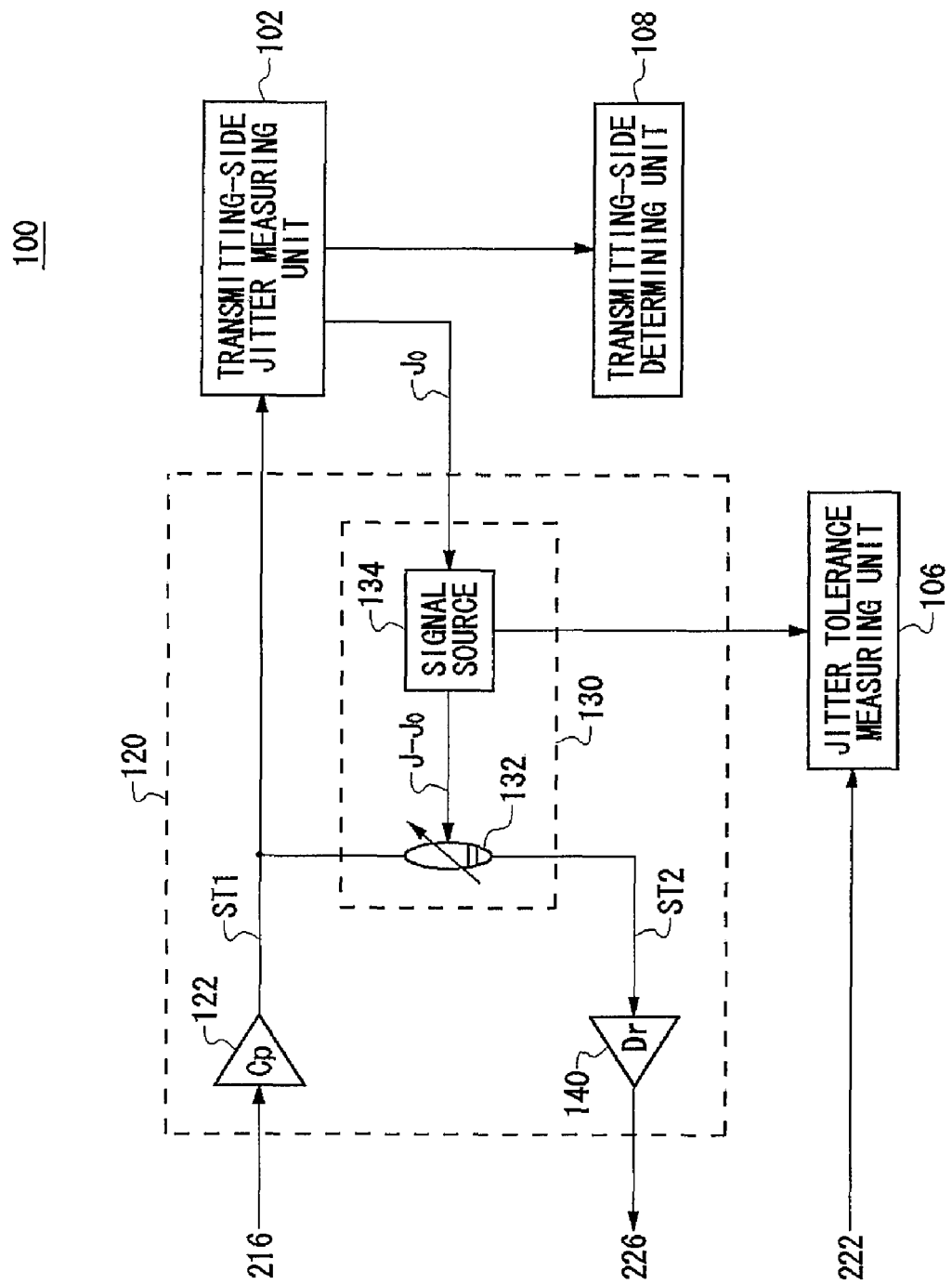
FIG. 3 is a diagram illustrating another example of the configuration of the test apparatus 100.

FIG. 3 is a diagram illustrating another example of the configuration of the test apparatus 100. The test apparatus 100 of the present example includes a jitter applying circuit 120, a transmitting-side jitter measuring unit 102, a jitter tolerance measuring unit 106, and a transmitting-side determining unit 108.

The jitter applying circuit 120 has the same configuration as that of the jitter applying circuit 120 explained with reference to FIG. 1. However, it should be noted that the jitter applying unit 130 applies, to the transmission signal ST2, a jitter J1 having an amplitude obtained by subtracting the amplitude of a jitter J0 which has occurred in the transmitting circuit 210 from the amplitude of a jitter J which should be applied to the transmission signal ST2. Since the jitter J0 is already applied to the transmission signal ST1 by the transmitting circuit 210, this subtracting operation enables the predetermined jitter J to be applied to the transmission signal ST2.

The transmitting-side jitter measuring unit 102 and transmitting-side determining unit 108 may be the same as the transmitting-side jitter measuring unit 102 and transmitting-side determining unit 108 which have been explained with reference to FIG. 1. However, the transmitting-side jitter measuring unit 102 may notify the amplitude value of the jitter J0 which it has measured, to the signal source 134. The signal source 134 applies, to the transmission signal ST2, the jitter J1, which is obtained by subtracting the amplitude value of the jitter J0 from the amplitude of the jitter J set as the jitter that should be generated.

The jitter tolerance measuring unit 106 determines whether or not the logical value of the transmission signal detected by an analyzing unit or the like of the receiving circuit 220 is equal to a preset expectation value, for each amplitude of the jitter J set by the jitter applying unit 130. In the test apparatus 100 of the present example, the amplitude of the jitter J set by the jitter applying unit 130 is equal to the amplitude of the jitter included in the transmission signal ST2 to be input to the receiving circuit 220. Therefore, the jitter tolerance measuring unit 106 can measure the jitter tolerance of the receiving circuit 220 from the amplitudes of the jitter set by the jitter applying unit 130.

The transmitting-side jitter measuring unit 102 explained with reference to FIG. 1 and FIG. 3 may have the transmitting circuit 210 transmit a clock signal as the transmission signal. For example, the transmitting-side jitter measuring unit 102 may have a pattern generator of the transmitting circuit 210 generate a clock pattern. Since this makes it possible to eliminate any jitter that is dependent on the data pattern of the transmission signal, it is possible to increase the ratio of the random component in the transmission signal by reducing the deterministic component.

In this case, the jitter applying unit 130 applies a random jitter to the transmission signal ST1 output from the transmitting circuit 210. Thus, the jitters that occur in the transmitting circuit 210 and in the jitter applying unit 130 are mostly random jitters. Hence, it is possible to precisely measure the jitter tolerance of the receiving circuit 220, by performing addition or subtraction of the amplitude values of the jitters. In this case, the jitter tolerance measuring unit 106 measures the jitter tolerance of the receiving circuit 220 to the random jitter.

Figure 4:
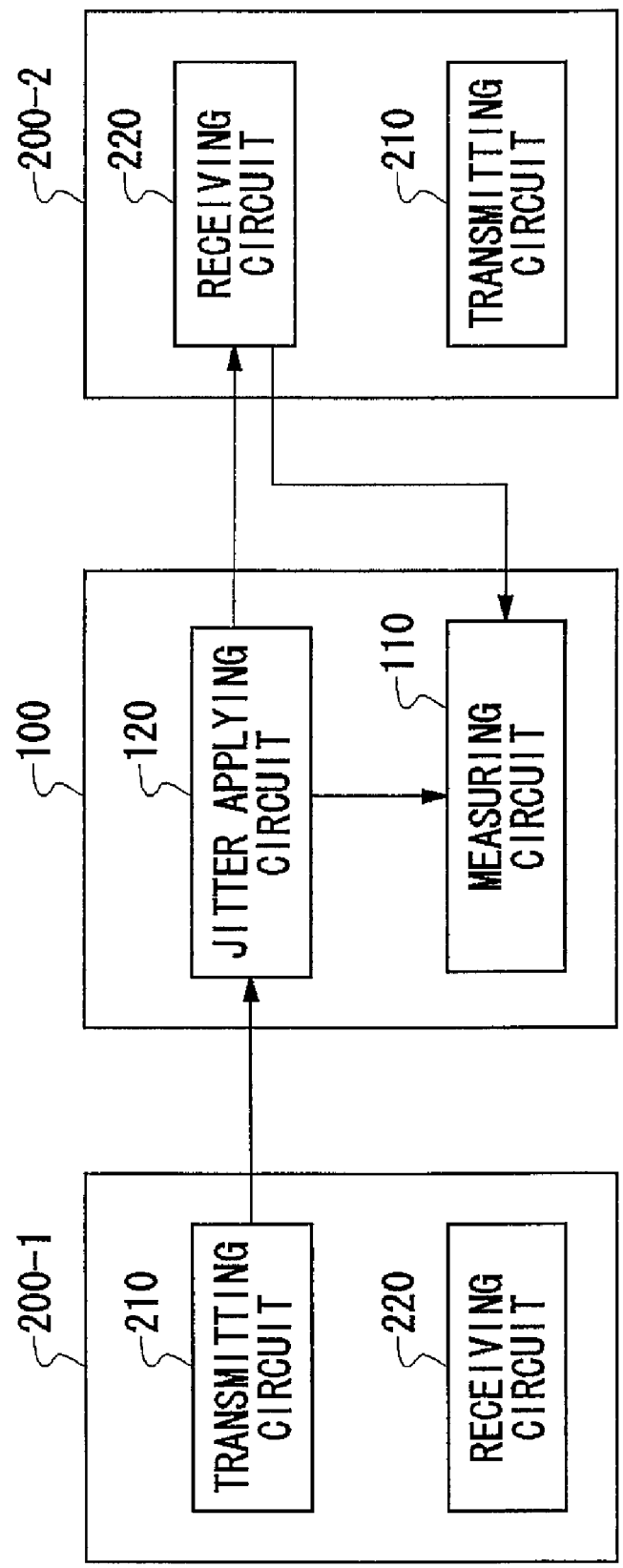
FIG. 4 is a diagram illustrating another example of use of the test apparatus 100.

FIG. 4 is a diagram illustrating another example of use of the test apparatus 100. The configuration of the test apparatus 100 of the present example is the same as that of the test apparatus 100 explained with reference to either FIG. 1 or FIG. 3. A measuring circuit 110 shown in FIG. 4 may include the transmitting-side jitter measuring unit 102, the jitter range measuring unit 104, the jitter tolerance measuring unit 106, and the transmitting-side determining unit 108 explained with reference to FIG. 1 and FIG. 3.

The jitter applying circuit 120 of the present example applies a jitter to a transmission signal received from a transmitting circuit 210, and inputs the signal to a receiving circuit 220 which is on a different chip from that which the transmitting circuit 210 is on. For example, the jitter applying circuit 120 may be provided between a first device under test 200-1 and a second device under test 200-2. The first device under test 200-1 and the second device under test 200-2 may each comprise a transmitting circuit 210 and a receiving circuit 220.

The jitter applying circuit 120 receives a transmission signal from the transmitting circuit 210 of the first device under test 200-1, applies a jitter to the transmission signal, and inputs it to the receiving circuit 220 of the second device under test 200-2. The measuring circuit 110 measures whether or not the logical value of the transmission signal detected by the receiving circuit 220 of the second device under test 200-2 is equal to an expectation value. Thus, the jitter tolerance of the receiving circuit 220 of the second device under test 200-2 can be tested. The first device under test 200-1 may be a device whose transmitting circuit 210 has previously been confirmed as a good one.

Figure 5:
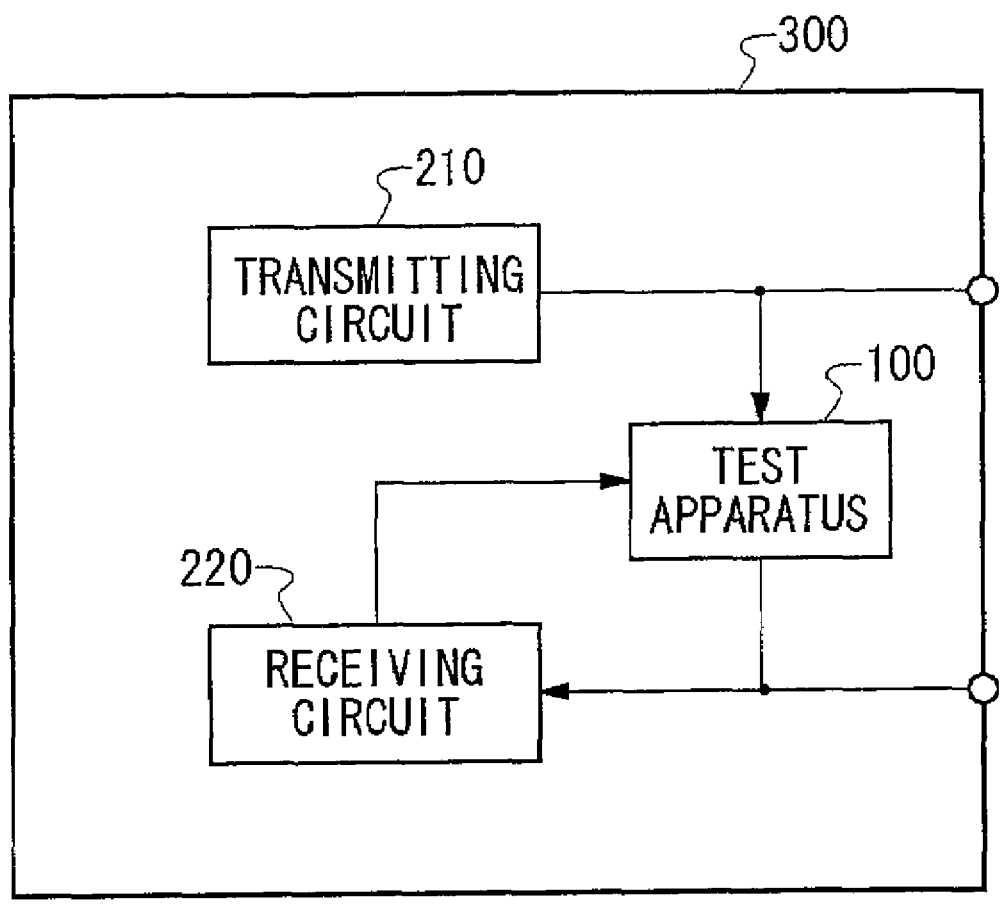
FIG. 5 is a diagram illustrating another example of use of the test apparatus 100.

FIG. 5 is a diagram illustrating another example of use of the test apparatus 100. The test apparatus 100 of the present example is provided on the same electronic device 300 as that on which a transmitting circuit 210 and a receiving circuit 220 are provided. Further, in another example, the test apparatus 100 may be provided on the same device as that on which either the transmitting circuit 210 or the receiving circuit 220 is provided.

When the electronic device 300 conducts a self-diagnosis, the test apparatus 100 may apply a jitter to a transmission signal output from the transmitting circuit 210 and loop the signal back to the receiving circuit 220 so that the signal is input to the receiving circuit 220. The loopback path may be provided inside the chip of the electronic device 300. The test apparatus 100 measures the jitter tolerance of the receiving circuit 220 as explained with reference to FIG. 1 and FIG. 3.

One aspect of the present invention has thus been explained through the embodiments, but the technical scope of the present invention is not limited to the scope of the disclosures of the foregoing embodiments. Various modifications or alterations can be made upon the foregoing embodiments. It is apparent from the statements of the claims that any modes that include such modifications or alterations would also be included in the technical scope of the present invention.

As clear from the above explanation, according to the embodiments of the present invention, it is possible to precisely measure the jitter tolerance of a receiving circuit.

What is claimed is:

1. A test apparatus which applies a jitter to a transmission signal output from a transmitting circuit and inputs the transmission signal to a receiving circuit, thereby to test jitter tolerance of the receiving circuit, the test apparatus comprising:

a transmitting-side jitter measuring unit which measures a jitter of the transmission signal output from the transmitting circuit;

a jitter applying unit which applies a jitter to the transmission signal output from the transmitting circuit, and inputs the transmission signal to the receiving circuit;

a jitter range measuring unit which determines whether or not a logical value of the transmission signal detected by the receiving circuit is equal to a preset expectation value for each amplitude of the jitter which the jitter applying unit applies to the transmission signal, and measures a range of amplitudes of the jitter within which the logical value of the transmission signal is equal to the expectation value; and a jitter tolerance measuring unit which calculates jitter tolerance of the receiving circuit, based on the jitter of the transmission signal measured by the transmitting-side jitter measuring unit, and the range of the amplitudes of the jitter measured by the jitter range measuring unit, wherein the jitter tolerance measuring unit calculates the jitter tolerance of the receiving circuit, by adding an amplitude value of the jitter of the transmission signal measured by the transmitting-side jitter measuring unit, to an upper limit of the range of the amplitudes of the jitter measured by the jitter range measuring unit.

2. The test apparatus according to claim 1, wherein:

the transmitting-side jitter measuring unit has the transmitting circuit transmit a clock signal as the transmission signal;

the jitter applying unit applies a random jitter to the transmission signal output from the transmitting circuit; and the jitter tolerance measuring unit calculates the jitter tolerance of the receiving circuit to the random jitter.

3. The test apparatus according to claim 1, further comprising a level comparing unit which receives the transmission signal output from the transmitting circuit, compares a signal level of the transmission signal with a preset threshold level, and outputs a logical value corresponding to a result of comparison as the transmission signal, wherein:
the jitter applying unit applies the jitter to the transmission signal output from the level comparing unit; and
the transmitting-side jitter measuring unit measures the jitter of the transmission signal output from the level comparing unit.

4. The test apparatus according to claim 1, further comprising a transmitting-side determining unit which determines whether the transmitting circuit is good or bad, based on the jitter measured by the transmitting-side jitter measuring unit.

5. The test apparatus according to claim 1, which tests the jitter tolerance of the receiving circuit, which is provided on a same chip as that on which the transmitting circuit is provided.

6. The test apparatus according to claim 1, which tests the jitter tolerance of the receiving circuit, which is provided on a different chip from that on which the transmitting circuit is provided.

7. A test apparatus which applies a jitter to a transmission signal output from a transmitting circuit and inputs the transmission signal to a receiving circuit, thereby to test jitter tolerance of the receiving circuit, the test apparatus comprising:

a transmitting-side jitter measuring unit which measures a jitter of the transmission signal output from the transmitting circuit;
a jitter applying unit which applies a jitter corresponding to the jitter measured by the transmitting-side jitter measuring unit to the transmission signal output from the transmitting circuit, and inputs the transmission signal to the receiving circuit; and
a jitter tolerance measuring unit which measures jitter tolerance of the receiving circuit by determining whether or not a logical value of the transmission signal detected by the receiving circuit is equal to a preset expectation value for each amplitude of the jitter which the jitter applying unit applies to the transmission signal,
wherein the jitter applying unit applies, to the transmission signal, a jitter having an amplitude which is obtained by subtracting an amplitude value of the jitter measured by the transmitting-side jitter measuring unit from a setting amplitude value set as an amplitude of the jitter that should be applied to the transmission signal to be input to the receiving circuit such that the jitter included in the transmission signal to be input to the receiving circuit has an amplitude equal to the setting amplitude.

* * * * *